United States Patent [19]
Dunnrowicz et al.

[11] Patent Number: 6,163,557
[45] Date of Patent: Dec. 19, 2000

[54] FABRICATION OF GROUP III-V NITRIDES ON MESAS

[75] Inventors: Clarence J. Dunnrowicz, Santa Cruz; Linda T. Romano, Sunnyvale; David P. Bour, Cupertino, all of Calif.

[73] Assignee: Xerox Corporation, Stamford, Conn.

[21] Appl. No.: 09/082,154

[22] Filed: May 21, 1998

[51] Int. Cl.[7] .......................... H01L 31/0312; H01S 5/00
[52] U.S. Cl. .............................. 372/46; 372/43; 372/44; 372/45; 257/77
[58] Field of Search .......................................... 372/43–46

[56] References Cited

U.S. PATENT DOCUMENTS

| | | | |
|---|---|---|---|
| 5,614,435 | 3/1997 | Petroff et al. | 437/110 |
| 5,874,747 | 2/1999 | Redwing et al. | 257/77 |

OTHER PUBLICATIONS

Stucky et al, Quantum Confinement & Host/Guest Chemestry: Probing a New Dimension, Science, vol. 247, Feb. 9, 1990, Articles 669–978.

Cope et al, Surfactants in Epitaxial Growth, vol. 63, No. 6, Aug. 7, 1989, 632–635.

J. Electrochem Soc.: SOLID—STATE SCIENCE AND TECHNOLOGY, vol. 130, No. 10, Oct. 1983, "The Mechanism of Orientation in Si Graphoepitaxy by Laser of Strip Heater Recrystallization", Henry I. Smith, et al., pp. 2050–2053.

J. Vac. Sci. Technol. B 12(6), Nov./Dec. 1994, "Threading dislocations in GaAs grown with free sidewalls on Si mesas" J. Knall et al., pp. 3069–3074.

J. Vac. Sci. Technol B 14(3), May/Jun. 1996, "Large blueshift in the photoluminescence of pseudomorphic InGaAs/GaAs quantum wells grown in patterned (100) GaAs grooves and ridges with vertical sidewalls", K. Kamath et al., pp. 2312–2314.

Nature: International weekly journal of science, vol. 386, No. 27, Mar. 1997, "Nitride—based semiconductors for blue and green light—emitting devices", F.A. Ponce et al., pp. 351–359.

J. Vac. Sci. Technol.., 15(3), May/Jun. 1978, "Surface relief gratings of 3200—Åperiod fabrication techniques and influence on thin–film growth", D.C. Flanders, et al., pp.1001–1003.

J. Vac. Sci. Technol. B 13(6), Nov./Dec. 1995, "First—order gain—coupled (Ga,In)As/(Al,Ga)As distributed feedback lasers by focused ion beam implantation and in situ overgrowth", Andreas Orth et al., pp. 2714–2717.

*Primary Examiner*—Frank G. Font
*Assistant Examiner*—Armando Rodriguez
*Attorney, Agent, or Firm*—Oliff & Berridge, PLC

[57] ABSTRACT

Group III–V nitride films are fabricated on mesas patterned either on substrates such as sapphire substrates, or on mesas patterned on group III–V nitride layers grown on substrates. The mesas provide reduced area surfaces for epitaxially growing group III–V nitride films, to reduce thermal film stresses in the films to reduce cracking. The surfaces of the mesas on which the films are grown are dimensioned and oriented to reduce the number of thin film crack planes that can grow on the mesas. Further cracking reduction in the films can be achieved by thinning the substrate to form membranes. The reduced substrate thickness at the membranes reduces the thermal expansion mismatch tensile stress in the films. The mesas can reduce or eliminate the occurrence of cracks in GaN or AlGaN epitaxial films grown on the mesas, for percentages of aluminum in the AlGaN films of up to about 18%. The improved group III–V nitride films can be used in optoelectronic devices including LEDs and edge and surface emitting laser diodes.

36 Claims, 3 Drawing Sheets

FABRICATION OF GROUP III-V NITRIDES ON MESAS

BACKGROUND OF THE INVENTION

1. Field of Invention

This invention is directed to the fabrication of III–V nitride semiconductor films on mesa structures for use in visible light emitting optoelectronic devices. More particularly, this invention is directed to III–V nitride structures.

2. Description of Related Art

High-efficiency solid-state electronic devices based on III–V nitrides have been fabricated that have a sufficiently wide bandgap for short-wavelength visible light emission. III–V nitrides have been used in light-emitting diode (LED) devices to provide bright green-to-ultraviolet light at high efficiencies. Known LEDs cover all three primary colors of the spectrum (red, green and blue). Accordingly, they can be used in various combinations to produce any color. III–V nitrides have also made possible diode lasers that operate at room temperature and emit shorter-wavelength visible light in the blue-violet range under continuous operation. These diode lasers emit coherent radiation and focus light into smaller spots, enabling higher-density optical information storage and printing. Blue lasers are particularly promising in this regard due to their short wavelength. In addition, blue lasers can potentially be combined with existing red and green lasers to create projection displays and color film printers.

III–V nitrides also provide the important advantage of having a strong chemical bond which makes these materials highly stable and resistant to degradation under high electric current and intense light illumination conditions that are present at active regions of the devices. These materials are also resistant to dislocation formation once grown.

GaN/AlGaN epitaxial films have been grown on sapphire substrates for optoelectreonic applications. Presently, a and c-oriented single crystal sapphire is the most commonly used substrate. Diode lasers formed using group III–V nitride films present problems because these lasers are inefficient and have a high current threshold. Accordingly, a high current is required to produce gain. This fact, coupled with the relatively high electrical resistance and the poor thermal conductivity of sapphire substrates makes heat generation a problem in these lasers. To increase laser efficiency, injected electrical carrier and optical confinement at the active regions needs to be increased, to reduce laser current threshold and related heating effects.

A known approach to increasing confinement at active regions in lasers is to increase the aluminum percentage in AlGaN cladding layers surrounding InGaN active regions. Increasing the aluminum percentage too much, however, can degrade the structure and optical properties of the epitaxial films. The epitaxial films become severely cracked for aluminum precentages of about 10% or greater.

SUMMARY OF THE INVENTION

Microscopic analysis has revealed that the spacing of these cracks is about 10 $\mu$m along the $\{10\bar{1}0\}$ prism planes of the GaN and AlGaN films. The cracks in the AlGaN cladding layers are highly undesirable because they cause light scattering and carrier recombination losses in the active region which degrades device efficiency and reliability.

Although the specific relationship between the aluminum percentage and the film cracking problem in AlGaN films is not presently known, several causes are possible. First, there is a thermal expansion mismatch between the epitaxial films and the sapphire substrate which places the films in tension. Second, alloy hardening due to increased aluminum concentration may promote film cracking during cooldown from the film growth temperature of about 1000° C. to room temperature.

Thus, improved quality group III–V nitride films, such as GaN/AlGaN films, on substrates for use in optoelectronic devices are needed. Particularly, improved structures comprising III–V nitride films grown on substrates are needed that have reduced cracking and improved electrical and optoelectronic properties. Optoelectronic devices comprising the improved structures that have enhanced device performance and reliability are also needed.

This invention provides structures including improved group III–V nitride films grown on substrates for use in optoelectronic devices.

A structure according to an embodiment of this invention comprises a substrate including at least one upstanding mesa having a top surface. A group III–V nitride epitaxial film is grown on the top surface of at least one of the mesas. The top surfaces provide reduced area surfaces for growing the III–V nitride films. The reduced area surfaces reduce thermal stresses in the films.

The mesas are typically polygonal shaped. For example, the mesas can be rhombohedral or rectangular shaped. In addition to the top surface, the mesas typically also include opposed end surfaces and opposed side surfaces.

According to an aspect of this invention, the substrates and the III–V nitride films have an epitaxial relationship that reduces cracking in the films. For example, the mesas can be patterned on a-planes or c-planes of sapphire substrates. The mesas can be oriented such that surfaces of the mesas are oriented along crack planes of the films, such as the m-planes of GaN or AlGaN films.

The top surfaces of the mesas are dimensioned to reduce stress and associated cracking in the films. To reduce or eliminate cracking in these films, the mesas can have a width dimension of less than about 10 microns, and the side surfaces and end surfaces of the mesas can be oriented along m-planes of the films.

The width of the mesas is preferably from about 2 microns to about 4 microns. This narrow width enables laser devices fabricated on the mesas to emit single mode beams.

The mesas can have various lengths depending on the purpose of devices fabricated on the mesas. Reducing the lengths of the mesas decreases the area of films deposited on the mesas, thereby reducing tensile stresses in the films. For GaN and AlGaN films, mesas for edge emitting devices having widths less than about 10 microns can significantly reduce or eliminate cracking along m-planes in the films. For VCSEL (Vertical Cavity Surface Emitting Laser) type devices, the mesas may be as small as 10 microns along the largest dimension.

The mesas are typically longitudinally aligned and spaced from each other by a distance as small as about 4 microns. Laser devices can be fabricated on closely spaced mesas to emit multiple single-mode beams.

By growing III–V nitride films on mesas, the amount of aluminum in the AlGaN cladding layers of the diode lasers can be increased, to increase electrical carrier and light confinement at active regions of the lasers. Increasing confinement increases device efficiency and reduces the current threshold and device heating during operation.

According to another aspect of this invention, mesas can be patterned on III–V nitride buffer layers deposited either on a continuous surface or on patterned substrates. Patterning buffer layers on unpatterned substrates such as sapphire substrate mesas provides extremely small mesa surfaces for fabricating optoelectronic devices on difficult to etch materials.

According to another aspect of this invention, the substrates can be thinned at selected regions to form membranes having reduced thicknesses to reduce thermal expansion mismatch tensile stresses in thin films grown on the membranes. To further decrease thermal expansion mismatch stresses in the films, the mesas can be patterned on membranes.

To increase heat dissipation from devices, a heatsink can be formed on the backsides of the membranes.

The structures according to this invention can be used in various laser devices such as edge emitting lasers and surface emitting lasers that emit visible light over a wide range of wavelengths.

BRIEF DESCRIPTION OF THE DRAWINGS

The preferred embodiments of this invention will be described in detail, with reference to the following figures, in which.

DETAILED DESCRIPTION OF PREFERRED EMBODIMENTS

This invention is directed to structures comprising improved group III–V nitride films ("III–V nitride films") grown on substrates for use in short-wavelength visible light emitting optoelectronic devices, including light emitting diodes (LEDs) and diode lasers. This invention is also directed to optoelectronic devices that comprise the improved structures. This invention also provides a method of fabricating the improved III–V nitride films on substrates.

The III–V nitrides comprise group III and V elements of the periodic table. The III–V nitrides can be binary compounds, as well as ternary and quarternary alloys. These materials are highly promising for use in short-wavelength light emitting devices for several important reasons. Specifically, the Al—Ga—In—N system has a large bandgap covering the entire visible spectrum. In addition, the III–V nitrides have a strong chemical bond which makes them very stable and resistant to degradation under conditions of high electric currents and intense light illumination found in the active regions of lasers.

III–V nitride films have high growth temperatures which have limited the number of suitable substrates for supporting epitaxial film growth. The differences between the lattice constants and the coefficients of thermal expansion of known substrates and the III–V nitride films have caused strain and high dislocation densities in the III–V nitride films.

The coefficient of thermal expansion mismatch between the substrates and the III–V nitride films causes tensile stresses in the films that are proportional to the area of the films deposited on the substrates. According to an aspect of this invention, III–V nitride epitaxial films are grown on reduced area surfaces to reduce tensile stresses in the III–V nitride films caused by the coefficient of thermal expansion mismatch. As described in greater detail below, the reduced area surfaces can be surfaces patterned on substrates, or surfaces patterned on III–V nitride films which are deposited on substrates. The growth of films on patterned surfaces is known as graphoepitaxy.

According to another aspect of this invention, the problem of cracking in III–V nitride films grown on substrates is significantly reduced or eliminated by growing III–V nitride films on mesas. The mesas provide reduced area surfaces on which the III–V nitride films are epitaxially grown. The mesas significantly reduce thermal stresses in the films. In addition, the reduced area surfaces of the mesas are dimensioned and the mesas are oriented on the substrates or III–V nitride films relative to the crack planes of the III–V nitride films, to reduce or eliminate cracking in the III–V nitride films.

Figure 1:
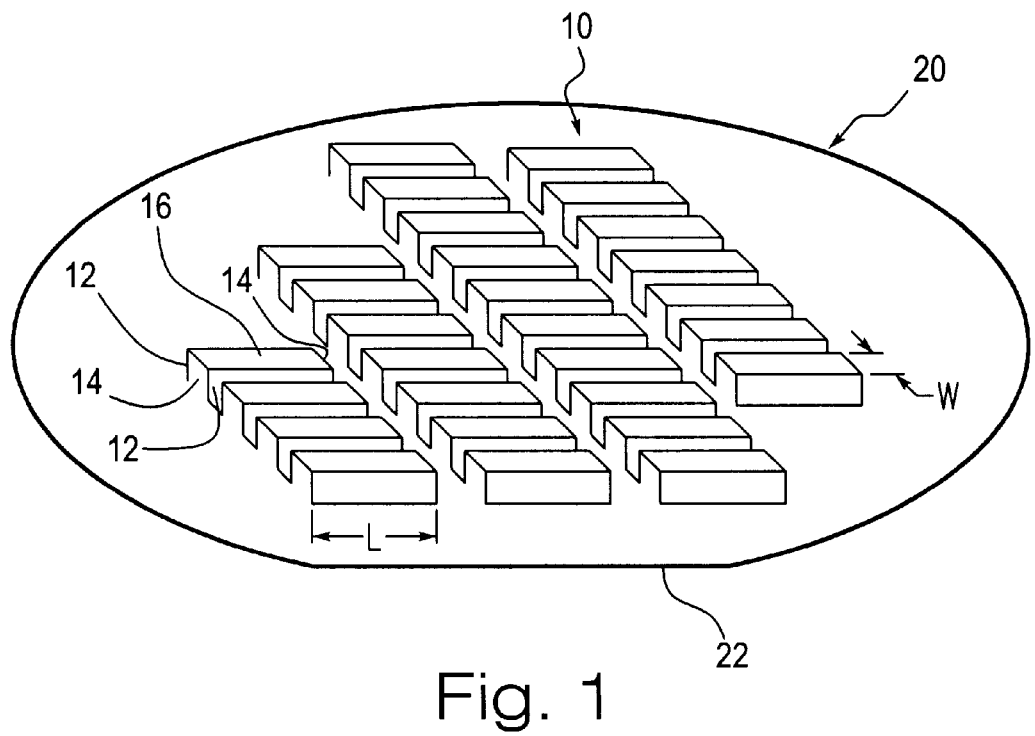
FIG. 1 illustrates mesas patterned on a c-plane sapphire substrate having an a-plane flat, according to this invention.

FIG. 1 illustrates a plurality of longitudinally aligned mesas 10 patterned on a sapphire substrate 20 according to an aspect of this invention. The mesas 10 are upstanding and include opposed side surfaces 12 extending along the length L of the mesas 10, opposed end surfaces 14 extending along the width W of the mesas 10, and a top surface 16. Epitaxial films are grown on the top surfaces 16 of the mesas 10.

Figure 2:
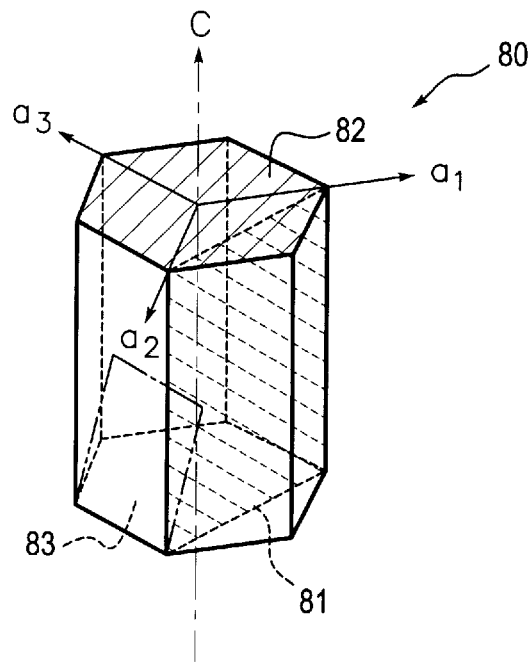
FIG. 2 illustrates the crystalline orientation of sapphire.
Figure 3:
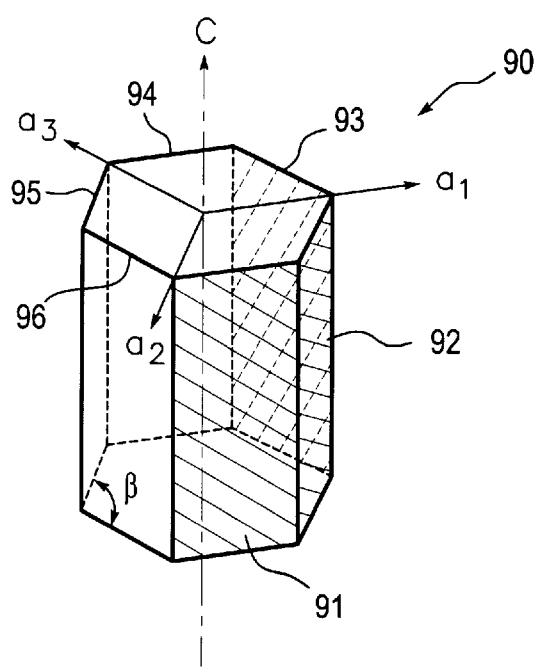
FIG. 3 illustrates the crystalline orientation of GaN.

The mesas 10 are shown patterned on an (0001) face (c-plane) of the sapphire substrate 20 which has an a-plane flat 22. The crystalline orientation of sapphire is illustrated in FIG. 2. FIG. 2 shows an exemplary sapphire crystal 80, having an a-plane 81; a c-plane 82; and an r-plane 83. The film/substrate epitaxial relationship for the growth of GaN films on the c-plane sapphire 20 is that the ($1\overline{1}00$) planes (m-planes) of the GaN films are parallel to the ($1\overline{2}10$) plane (a-plane flat 22) of the sapphire 20. The crystalline orientation of GaN is shown in FIG. 3. FIG. 3 shows an exemplary GaN crystal 90, having six faces, or m-planes, 91–96. The side surfaces 12 of the mesas 10 are oriented parallel to the a-plane flat 22 of the sapphire substrate 20 and, therefore, to the ($10\overline{1}0$) planes, or $m_1$ planes 91, of the GaN films. The end surfaces 16 of the mesas 10 are oriented parallel to either the ($01\overline{1}0$) planes, or $m_2$ planes 92, or the ($\overline{1}100$) planes, or $m_3$ planes 93, of the GaN films.

As explained, GaN and AlGaN epitaxial films grown on sapphire substrates according to known processes are subject to crack formation in the epitaxial films at aluminum concentrations in the AlGaN films of more than about 10%. These cracks have a spacing of about 10 microns along the $\{10\overline{1}0\}$ m-planes 91 of the GaN and AlGaN films. Referring to FIG. 3, the cracks occur along opposed m-planes in the GaN films, such as the m-planes 91 and 94, having a spacing of about 10 microns. Cracks can also occur along the other m-planes 92, 93, 95 and 96. Adjacent pairs of m-planes form angles β of about 120° relative to each other. The cracks also occur at about the same spacing along m-planes in AlGaN films.

According to an aspect of this invention, the mesas 10 overcome the problem of cracking in GaN and AlGaN films grown on sapphire substrates. As explained, in FIG. 1, the side surfaces 12 of the mesas 10 on the sapphire substrate 20 are parallel to the $\{10\overline{1}0\}$ m-planes of GaN films grown on the mesas 10. The mesas 10 have a width of less than about 10 microns, which is less than the crack spacing. As a result, the GaN and AlGaN films can include no more than one (10$\overline{1}$0) m-plane extending along the length L of the mesas 10. Thus, strain in the GaN and AlGaN films can be relieved at the film edges and the possibility of cracks forming along the m-planes on the mesas 10 is significantly reduced or eliminated.

According to another aspect of this invention, the mesas 10 preferably have a width of from about 2 microns to about 4 microns so that diode lasers fabricated on the mesas 10, as described in greater detail below, also have about this same width at the active regions from which light is emitted. This active region width enables the lasers to emit single mode beams and focus light onto extremely small spot sizes.

Figure 4:
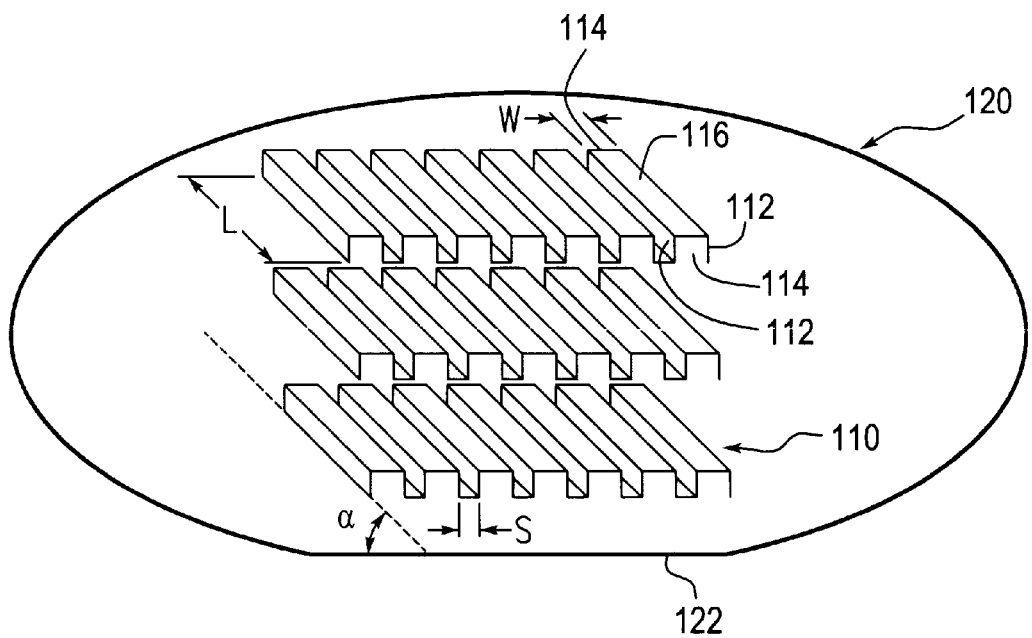
FIG. 4 illustrates mesas patterned on an a-plane sapphire substrate having a c-plane flat, according to this invention.

As another example, mesas 110 can be patterned on a-plane sapphire substrate 120 having a c-plane flat 122 as shown in FIG. 4. The film/substrate epitaxial relationship in this example is that the (1$\overline{1}$00) planes of the GaN films are parallel to the (11$\overline{2}$1) plane of the sapphire substrate 120. The (1$\overline{1}$02) plane of the sapphire substrate 120 is oriented at an angle $\alpha$ of 60° relative to the c-flat 122. Therefore, the side surfaces 112 of the mesas 110 are oriented along the (1$\overline{1}$02) plane of the sapphire substrate 120, and the end surfaces 114 of the mesas 110 are parallel to the c-plane flat 122. The widths W of the mesas 110 are less than 10 microns and preferably less than about 4 microns. This orientation and width dimension of the mesas 110 also minimizes the formation of cracks in GaN and AlGaN epitaxial films transverse to devices.

The length of the mesas 10 and 110 patterned on substrates can be varied depending on the optimum cavity length for the intended uses of the lasers fabricated on the substrates. Increasing the length (and width) of the mesas increases the laser power. Decreasing the length of the mesas reduces the areas of epitaxial films grown on the mesas and, accordingly, reduces stresses and associated cracking in the films. For example, referring to FIGS. 1 and 4, reducing the length L of mesas 10 and 110 reduces the number of m-planes of GaN and AlGaN films that are parallel to the end faces 14 and 114 of the mesas 10 and 110 along their length L. In fact, reducing the length L of the mesas 10 and 110 to less than about 10 microns reduces the maximum number of such m-planes parallel to the end faces of the mesas 10 and 110 to one.

Referring to FIG. 4, the mesas 110 can be spaced from each other on the substrate by a distance S of from about 4 microns to about 50 microns. If the mesas 110 are too close together, then optoelectronic devices fabricated on adjacent mesas 110 can electrically interfere with each other. Accordingly, the mesa separation distance S is preferably greater than about 4 microns to avoid this problem. Increasing the mesa separation distance S reduces the number of devices than can be formed on a given substrate.

The mesas 10 and 110 can have various shapes. The rhombohedral mesa shape shown in FIGS. 1 and 4 is advantageous to match the orientation of m-planes of GaN and AlGaN films. That is, the side faces and end faces of the mesas 10 and 110 align with m-planes of the GaN films. The mesas 10 and 110 can have other polygonal shapes as well, including rectangular. The most desirable mesa shape can be selected depending on the epitaxial relationship between the material which is patterned to form the mesas 10 or 110, and the group III–V nitride grown on the mesas 10 or 110.

The group III–V nitride film formed on the mesas 10 and 110 can be a buffer layer. For example, the film can be a GaN buffer layer, an AlN buffer layer, or the like. Buffer layers relieve the lattice mismatch with the substrate, so that films epitaxially grown on the buffer layer form devices having improved lattice structures. Buffer layers also promote two-dimensional film growth, which promotes the growth of smooth epitaxial thin films on the buffer layers.

By reducing cracking in the III–V nitride films grown on the mesas 10 and 110, the propagation of cracks into subsequent epitaxial films of stacks grown on the mesas 10 and 110 is also reduced. For example, in InGaN quantum well diode lasers, AlGaN epitaxial films are grown on GaN films and other III–V nitride film compositions to function as cladding layers surrounding InGaN films. The formation of cracks in AlGaN films is reduced by forming the GaN films on the mesas 10 and 110. By reducing cracks and other defects in the cladding layers, electrical carrier and light confinement is enhanced, thereby reducing the laser current threshold. Reducing the current threshold reduces heating during device operation and thus increases the lifetime of the diode lasers.

In addition, by reducing cracking in GaN and AlGaN films by growing GaN films on the reduced area surfaces of mesas 10 and 110, and also by controlling the epitaxial relationships of the substrate and the films and the dimensions of the mesas 10 and 110 and films, the amount of aluminum in the AlGaN cladding layers can be increased as compared to the amount of aluminum that has been used in known devices. Increasing the amount of aluminum in the cladding layers increases the index of refraction and the band gap of the cladding layers, thereby increasing electrical carrier and light confinement. However, increasing the amount of aluminum can also make it more difficult to inject carriers into the active regions of the laser diodes, such as InGaN active regions. In view of these factors, according to an aspect of this invention, the aluminum content of the AlGaN cladding layers can be up to about 18%. This percentage represents a significant increase over that which has been successfully used in known devices. In general, as device size decreases, the amount of stress in the AlGaN films decreases, and the amount of aluminum in the AlGaN films can be increased.

The mesas 10 and 110 can be formed by patterning any suitable substrate material. Sapphire is the most commonly used substrate material for growing epitaxial III–V nitride films. In addition to sapphire, other known substrates suitable for epitaxially growing III–V nitride films include SiC and spinel, which each have advantages and disadvantages compared to sapphire. Particularly, SiC is easier to etch, has closer lattice matching with III–V nitrides, and has a higher thermal conductivity. SiC is also much more expensive than sapphire. Spinel also has closer lattice matching with III–V nitrides than sapphire, but is a poorer thermal conductor. Accordingly, it is more difficult to remove heat during operation from devices fabricated on spinel substrates. Spinel is also more expensive and less readily available than sapphire. In view of these relative advantages and disadvantages, the most appropriate substrate for a given application can be selected based on the particular device fabricated on the substrate. It is important to explain, however, that for a given substrate material, the film growth technique described above permits greater flexibility with respect to film composition while retaining good film morphology.

The mesas 10 and 110 can be patterned in substrates using conventional lithography and etching techniques known in the art. For example, sapphire substrates can be patterned to form the mesas 10 and 110 by dry etching using a reactive ion etching (RIE) technique in a halogen-containing gas using a patterned mask, such as a nickel mask.

The mesas 10 and 110 can alternately be patterned on substrates using a suitable laser. For example, short wavelength excimer lasers can be used to directly etch sapphire using ablation. The advantage of using excimer lasers is that the optical beam can be focused to a small spot size and only a minimal heat affected zone is produced surrounding the etched area.

According to another aspect of this invention, the mesas 10 and 110 can optionally be patterned on pre-deposited III–V nitride buffer layers such as GaN or AlN films grown on substrates. The buffer layers can be grown on continuous substrates or on mesas patterned on substrates. This approach enables the formation of closely spaced mesas on substrate mesas. For example, two or more GaN or AlN mesas having a separation of about 4 microns can be formed on individual sapphire mesas. Multiple optoelectronic devices, such as laser diodes, can be fabricated on the GaN or AlN mesas.

The mesas 10 and 110 can be fabricated by dry etching III–V nitride films such as GaN or AlN films grown on either continuous surface or mesa-patterned substrates such as sapphire substrates. For example, the nitride film mesas can be formed by a conventional RIE process. The dimensions and orientations of the mesas 10 and 110 on the GaN or AlN films can be the same as described above regarding the mesas 10 and 110 patterned on sapphire.

Figure 5:
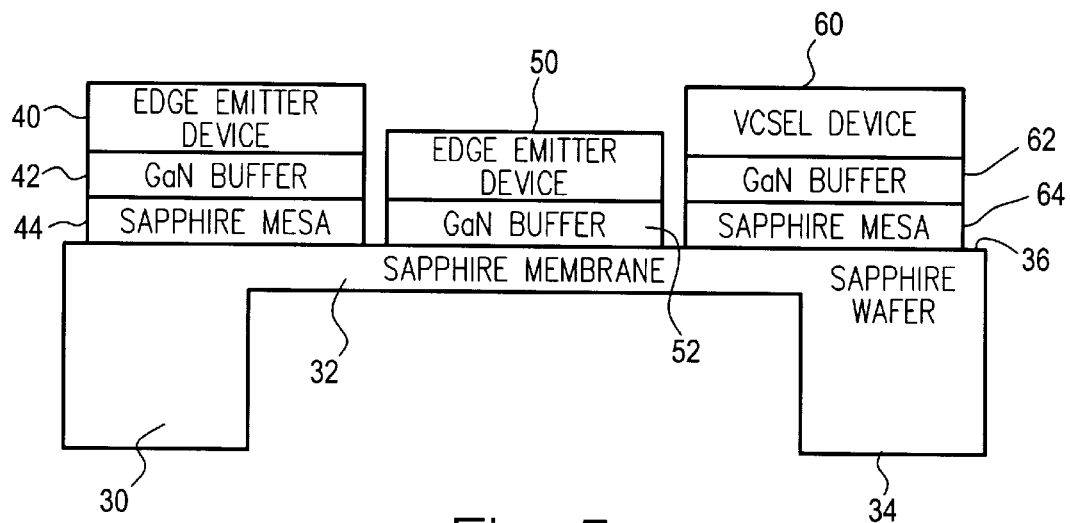
FIG. 5 illustrates exemplary semiconductor devices that can be fabricated on mesas according to this invention.

The thermal expansion mismatch tensile stress between the epitaxial film and substrate is proportional to sapphire substrate thickness. According to another aspect of this invention, the thickness of the sapphire substrate is reduced to reduce the thermal expansion mismatch tensile stress. Referring to FIG. 5, substrates such as the illustrated sapphire wafer substrate 30, can be machined to form regions, or membranes 32, of reduced thickness. The membranes 32 can be formed by machining the backside 34 of the substrate 30, which is opposite to the front side 36 of the substrate 30 on which the mesas 10 and 110 are formed. For example, sapphire membranes 32 having a thickness of about 2 mil can be formed in an about 10–15 mil thick sapphire substrate 30. The membranes 32 partially relieve film stresses in epitaxial films of devices grown on the membranes 32 by elastic bowing of the membranes 32.

Selective backside thinning of the substrate 30 provides additional advantages as well. Backside thinning improves device cooling during operation. Device cooling can be further enhanced by using plated heatsink technology, or by directly mounting the thin membranes 32 on heat spreaders such as diamond heat spreaders. In addition, the thin membranes 32 facilitate final device separation by excimer laser machining or other suitable separation techniques. Furthermore, the laser current threshold in laser devices can be reduced by coating the thinned substrate backside with a metallization sequence that has good reflectance at the wavelength of the device. For example, the metallization sequence can be aluminum-titanium/tungsten-gold at blue wavelengths as described below.

FIG. 5 illustrates several exemplary mesa/device structures that can be formed on thinned sapphire membranes 32 formed according to this invention. An edge emitting laser 40 is grown with a buffer layer 42, such as a GaN or AlN buffer layer, on a patterned sapphire mesa 44.

An edge emitting laser 50 is grown on a mesa-patterned GaN buffer layer 52 grown on the membrane 32.

A vertical cavity surface emitting laser (VCSEL) 60 is grown on a GaN buffer layer 62 deposited on a patterned sapphire mesa 64.

According to another aspect of this invention, by patterning the mesas 10 and 110 on the membranes 32 formed in the substrate 30, the stresses in epitaxial films grown on the mesas 10 and 110 can be further reduced, to further reduce cracking in the films. Alternately, thin group III–V films such as GaN or AlN buffer layers can be patterned to form mesas for supporting epitaxial film growth.

The membranes 32 can be formed, for example, by ultrasonic machining of sapphire. Furthermore, by using a combination of backside ultrasonic machining with conventional chemical-machining polishing at the frontside of the membrane 32, it is possible to form even thinner sapphire membranes.

Figure 6:
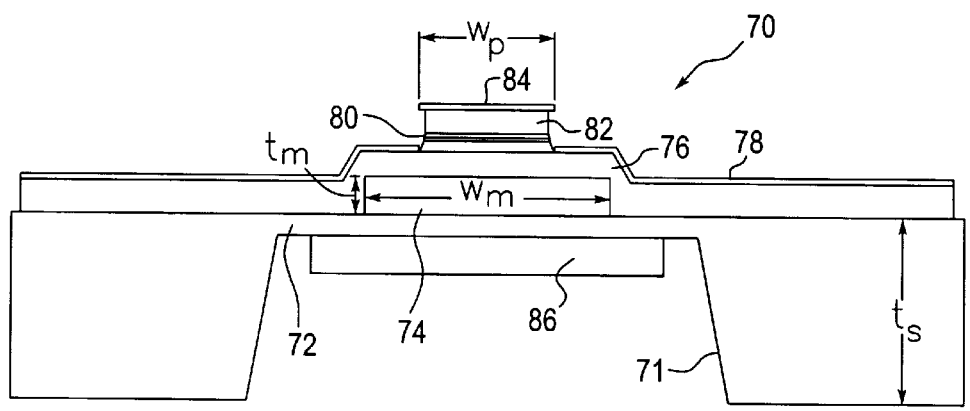
FIG. 6 illustrates a semiconductor device and a heat sink fabricated on a mesa according to this invention.

FIG. 6 illustrates in greater detail an exemplary self-aligned edge emitting laser 70 fabricated on a sapphire membrane 72 of a sapphire substrate 71, and a mesa 74 patterned on the membrane 72. The mesa 74 can be sapphire mesa 10, 110 or a group III–V nitride mesa such as a GaN or AlN buffer layer mesa, depending on whether the sapphire membrane 72 or the buffer layer is patterned. The sapphire membrane 72 and the buffer layer can each be patterned to form sapphire mesas 10, 110 and GaN mesas in the same device. An n-doped film 76 including n-doped GaN or AlGaN is grown on the mesa 74. A metal film 78, including Ti/Au or the like, is evaporated on the n-doped film 76. The 70 device further comprises a quantum well region 80 including one or more quantum wells having AlGaN cladding layers and InGaN layers; a p-doped layer 82 including p-doped GaN or AlGaN; and a metallic plating layer 84 such as Ni/Au. A heatsink 86 is plated on the backside of the sapphire membrane 72 to dissipate heat generated during operation of the laser 70. The heatsink 86 can be, for example, an Al-TiW-Au plated heatsink.

In the laser 70, typical dimensions are that the sapphire substrate 71 has a thickness $t_s$ of about 250 microns, the sapphire membrane 72 has thickness $t_m$ of about 2 microns, the mesa 74 has a width $w_m$ of from about 4 microns to about 10 microns and a thickness $t_m$ of about 2 microns, and the metallic plating 84 has a width $w_p$ of about 3 microns.

Laser window facets can be fabricated by various techniques including, for example, RIE, chemically assisted ion beam etching (CAIBE), or conventional mechanical-chemical polishing techniques following device separation.

Experiments of GaN epitaxial film growth on the sapphire mesas show that GaN films can be grown with free sidewalls. That is, GaN deposited only on the top surfaces of the mesas and did not deposit on the sidewalls of the mesas. The GaN films that were deposited overhung the mesa edges with vertical sidewalls and showed distinct hexagonal facets. These results show that mesa growth produces well-isolated GaN devices. The free sidewalls of the mesas promote film relaxation instead of crack formation.

While the invention has been described in conjunction with the specific embodiments described above, it is evident that many alternatives, modifications and variations are apparent to those skilled in the art. Accordingly, the preferred embodiments of the invention as set forth above are intended to be illustrative and not limiting. Various changes can be made without departing from the spirit and scope of the invention.

What is claimed is:

1. A structure comprising:
    a substrate including at least one upstanding mesa, each mesa having a top surface; and
    a group III–V nitride epitaxial film on the top surface of at least one mesa;

wherein the at least one mesa including surfaces oriented along crack planes of the epitaxial film.

2. The structure of claim 1, wherein:
the substrate is a sapphire substrate;
each of the mesas is disposed on a c-plane of the sapphire substrate;
the epitaxial film includes GaN;
the top surface of each mesa has a width of less than about 10 microns; and
each mesa further includes side surfaces and end surfaces oriented along m-planes of the GaN epitaxial film.

3. The structure of claim 2, wherein the top surface of each mesa has a width of from about 2 microns to about 4 microns.

4. The structure of claim 2, wherein the top surface of each mesa has a length of less than about 10 microns.

5. The structure of claim 1, wherein:
the substrate is a sapphire substrate;
each mesa is disposed on an a-plane of the sapphire substrate;
the epitaxial film includes GaN;
the top surface of each mesa has a width of less than about 10 microns; and
each mesa further includes side surfaces and end surfaces oriented along m-planes of the GaN epitaxial film.

6. The structure of claim 5, wherein the top surface of each mesa has a width of from about 2 microns to about 4 microns.

7. The structure of claim 5, wherein the top surface of each mesa has a length of less than about 10 microns.

8. The structure of claim 1, wherein the at least one mesa comprises a plurality of mesas spaced from each other by a distance of more than about 4 microns.

9. The structure of claim 1, wherein the at least one mesa comprises a plurality of mesas spaced from each other by a distance of less than about 50 microns.

10. The structure of claim 1, wherein:
the substrate includes a thinned membrane; and
at least one mesa of the at least one mesa is disposed on the membrane.

11. The structure of claim 1, wherein the epitaxial film comprises GaN, and the structure further comprises an AlGaN epitaxial film formed on the GaN epitaxial film, the AlGaN epitaxial film having an aluminum concentration of up to about 18%.

12. A structure comprising:
a substrate; and
a patterned group III–V nitride film formed on the substrate, the group III–V nitride film including at least one upstanding mesa, each mesa having a top surface.

13. The structure of claim 12, wherein the group III–V nitride film is comprised of GaN, the top surfaces of the mesas have a width of less than about 10 microns, and the mesas further include side surfaces and end surfaces oriented along m-planes of the GaN.

14. The structure of claim 13, wherein the top surfaces of the mesas have a width of less than about 4 microns.

15. The structure of claim 13, wherein the top surfaces of the mesas have a length of less than about 10 microns.

16. The structure of claim 12, wherein the mesas are spaced from each other by a distance of from about 4 microns to about 50 microns.

17. The structure of claim 12, wherein the substrate is a sapphire substrate having a continuous planar surface on which the group III–V nitride film is disposed.

18. The structure of claim 12, wherein the substrate includes at least one upstanding mesa, the mesas on the substrate each having a top surface, and the group III–V nitride film mesas are disposed on the top surfaces of the substrate mesas.

19. The structure of claim 18, wherein the top surfaces of the substrate mesas have a width of less than about 10 microns.

20. The structure of claim 18, wherein the top surfaces of the substrate mesas have a width of less than about 4 microns.

21. The structure of claim 12, wherein the substrate includes a thinned membrane, and at least one mesa is disposed on the membrane.

22. The structure of claim 12, wherein the epitaxial film is comprised of GaN, and the structure further comprises a AlGaN epitaxial film having an aluminum concentration of up to about 18% on the GaN.

23. A method of forming a structure, comprising:
providing a substrate; and
patterning the substrate to form at least one mesa, each mesa including a top surface;
epitaxially growing a group III–V nitride epitaxial film on the top surface of at least one mesa the at least one mesa including surfaces oriented along crack planes of the epitaxial film.

24. The method of claim 23, wherein patterning the at least one mesa comprises reactive ion etching the substrate.

25. The method of claim 23, wherein patterning the at least one mesa comprises ablating the substrate using an excimer laser.

26. The method of claim 23, wherein:
the group III–V nitride film comprises a GaN film;
the top surface of each mesa has a width of less than about 10 microns; and
each mesa further includes side surfaces and end surfaces oriented along m-planes of the GaN film.

27. The method of claim 26, wherein the substrate comprises sapphire and the at least one mesa is formed on a c-plane or an a-plane of the sapphire substrate.

28. The method of claim 23, further comprising:
thinning the substrate to form a membrane; and
forming at least one mesa of the at least one mesa on the membrane.

29. The method of claim 23, wherein the group III–V nitride film comprises GaN, and further comprising forming an AlGaN epitaxial film having an aluminum concentration of up to about 18% on the GaN film.

30. A method of forming a structure, comprising the steps of:
providing a sapphire substrate;
forming a GaN film on the sapphire substrate;
forming a plurality of upstanding mesas in the GaN film, each mesa including a top surface, opposed side surfaces and opposed end surfaces;
wherein the top surfaces of the at least one mesa have a width of less than about 10 microns, and the side surfaces and end surfaces of the at least one mesa are oriented along m-planes of the GaN film.

31. The method of claim 30, wherein the GaN film is formed on an a-plane or a c-plane of the sapphire substrate.

32. The method of claim 30, wherein the GaN film is formed on a continuous planar surface of the sapphire substrate.

33. The method of claim 30, further comprising prior to forming the GaN film on the sapphire substrate:

forming a plurality of mesas on the sapphire substrate, each mesa of the sapphire substrate including a top surface; and wherein the epitaxial thin film of GaN is formed on the top surface of at least one of the plurality of the mesas of the sapphire substrate.

34. The method of claim 33, wherein the top surfaces of the plurality of mesas on the sapphire substrate each have a width of less than about 10 microns.

35. The method of claim 30, further comprising thinning the sapphire substrate to form a membrane, and forming at least one of the plurality of the mesas in the GaN film on the membrane.

36. The method of claim 30, further comprising forming a AlGaN epitaxial film having an aluminum concentration of up to about 18% on the GaN film.

* * * * *

UNITED STATES PATENT AND TRADEMARK OFFICE
CERTIFICATE OF CORRECTION

PATENT NO. : 6,163,557 Page 1 of 1
DATED : December 19, 2000
INVENTOR(S) : Clarence J. Dunnrowicz et al.

It is certified that error appears in the above-identified patent and that said Letters Patent is hereby corrected as shown below:

<u>Column 1,</u>
Line 3, insert as a new paragraph:
-- This invention was made with Government support under Agreement No. MDA972-95-3-0008 and Agreement No. MDA972-96-3-0014 awarded by ARPA. The Government has certain rights in this invention. --.

Signed and Sealed this

Thirteenth Day of June, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,163,557 | Page 1 of 1 |
| APPLICATION NO. | : 09/082154 | |
| DATED | : December 19, 2000 | |
| INVENTOR(S) | : Clarence J Dunnrowicz et al. | |

It is certified that error appears in the above-identified patent and that said Letters Patent is hereby corrected as shown below:

Column 1, line 3, insert as a new paragraph:

--This invention was made with Government support under Agreement No. 70NANB2H1241 awarded by the Department of Commerce and Agreement Numbers MDA972-95-3-0008 and MDA972-96-3-0014 awarded by ARPA. The Government has certain rights in this invention.--

Signed and Sealed this

Fourteenth Day of April, 2009

JOHN DOLL
*Acting Director of the United States Patent and Trademark Office*

UNITED STATES PATENT AND TRADEMARK OFFICE
CERTIFICATE OF CORRECTION

| | |
|---|---|
| PATENT NO. | : 6,163,557 |
| APPLICATION NO. | : 09/082154 |
| DATED | : December 19, 2000 |
| INVENTOR(S) | : Clarence J Dunnrowicz et al. |

It is certified that error appears in the above-identified patent and that said Letters Patent is hereby corrected as shown below:

Replace the paragraph inserted after column 1, line 3 by the Certificates of Correction dated June 13, 2006 and April 14, 2009, with the paragraph:

-- This invention was made with Government support under Agreement No. 70NANB2H1241 awarded by the Department of Commerce and Agreement No. MDA972-95-3-0008 awarded by ARPA. The Government has certain rights in this invention. --

Signed and Sealed this

Ninth Day of February, 2010

David J. Kappos
*Director of the United States Patent and Trademark Office*